US006790733B1

(12) United States Patent
Natzle et al.

(10) Patent No.: US 6,790,733 B1
(45) Date of Patent: Sep. 14, 2004

(54) PRESERVING TEOS HARD MASK USING COR FOR RAISED SOURCE-DRAIN INCLUDING REMOVABLE/DISPOSABLE SPACER

(75) Inventors: Wesley C. Natzle, New Paltz, NY (US); Bruce B. Doris, Brewster, NY (US); Sadanand V. Deshpande, Fishkill, NY (US); Renee T. Mo, White Plains, NY (US); Patricia A. O'Neil, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,296

(22) Filed: Mar. 28, 2003

(51) Int. Cl.[7] ............................................. H01L 21/336
(52) U.S. Cl. ....................... 438/300; 438/303; 438/595; 438/976
(58) Field of Search ................................ 438/197, 199, 438/230, 299, 300, 303, 585, 595, 976

(56) References Cited

U.S. PATENT DOCUMENTS 6,353,249 B1 * 3/2002 Boyd et al. ................. 257/369
2002/0163036 A1 * 11/2002 Miura et al. ................ 257/336

* cited by examiner

*Primary Examiner*—Jack Chen
(74) *Attorney, Agent, or Firm*—Scully, Scott, Murphy & Presser; Joseph P. Abate, Esq.

(57) ABSTRACT

The present invention provides a method for preserving an oxide hard mask for the purpose of avoiding growth of epi Si on the gate stack during raised source/drain formation. The oxide hard mask is preserved in the present invention by utilizing a method which includes a chemical oxide removal processing step instead of an aqueous HF etchant.

23 Claims, 6 Drawing Sheets

PRESERVING TEOS HARD MASK USING COR FOR RAISED SOURCE-DRAIN INCLUDING REMOVABLE/DISPOSABLE SPACER

BACKGROUND OF INVENTION

The present invention relates to complementary metal oxide semiconductor (CMOS) device manufacturing, and more particularly to a method and integration scheme to use chemical oxide removal (COR) to preserve an oxide hard mask for the purpose of avoiding silicon growth on the gate stack during raised source/drain formation. Silicon growth on the gate stack must be prevented in order to avoid interference with spacer removal and extension implants. The presence of the oxide hard mask also significantly enhances yield.

Prior art raised source/drain (RSD) processing includes a disposable spacer and a gate cap flow. In such prior art processing, a SiN layer is used as a hard mask to etch the gate stack, which is located atop a semiconductor substrate. After etching of the gate stack, the SiN layer is left atop the gate stack. SiN spacers are next fabricated on the sidewalls of the gate stack to completely "encapsulate" the gate stack. Next, a pre-RSD cleaning step is performed on exposed surfaces of the semiconductor substrate abutting the gate stack, after which the RSD regions are grown. Typically, the pre-RSD cleaning step includes the use of aqueous HF based chemistries and then RSD regions are grown. The spacers and the cap are then removed by hot phosphoric acid.

One advantage of such prior art RSD processing is that bridging from the gate to the source/drain is substantially reduced or even eliminated. Another advance of the foregoing processing scheme is that it enables the RSD to be grown on an intrinsic surface. Moreover, the overall thermal budget that the extensions experience can be substantially minimized since the extensions may be implanted after the RSD.

Although the advantages of the RSD disposable spacer scheme described above are attractive, there are several disadvantages. Specifically, any corner rounding of the SiN hard mask during the gate stack etch may lead to exposed portions of the gate during RSD growth. Selective silicon will grow on any region of exposed Si, which causes unwanted protuberances that can block implants. Another drawback of the prior art RSD disposable spacer scheme is that the SiN hard mask is more difficult to controllably trim. In addition, the removal process for SiN by hot phosphoric acid is capable of pitting Si and can leave appreciable amounts of metal contamination.

In view of the drawbacks mentioned above with the prior art RSD disposable spacer scheme, there is a need for developing a new and improved processing scheme for forming RSD regions that avoids the disadvantages mentioned above.

SUMMARY OF INVENTION

One object of the present invention Is to provide a method of fabricating a CMOS device having RSD regions.

Another object of the present invention is to provide a method of fabricating a CMOS device having RSD regions in which silicon growth on the gate stack is avoided during formation of the RSD regions.

A yet further object of the present invention is to provide a method of fabricating a CMOS device having RSD regions in which problems with spacer removal and extension implant formation Is substantially eliminated.

A still further object of the present invention is to provide a method of fabricating a CMOS device having RSD regions in which an oxide hard mask is employed that is more easily trimmed than is a SiN hard mask.

Another object of the present invention is to provide a method of fabricating a CMOS device having RSD regions in which no substantial amount of pitting of Si occurs.

An even further object of the present invention is to provide a method of fabricating a CMOS device having RSD regions in which no substantial metal contamination is observed.

A still even further object of the present invention is to provide a method of fabricating a CMOS device in which $SiO_2$ disposable spacers are employed.

A yet even further object of the present invention is to provide a method of fabricating a CMOS device having RSD regions In which all of the advantages of the prior art RSD integration scheme mentioned above are obtained, while overcoming all of the disadvantages thereof.

These and other objects and advantages are obtained in the present invention by utilizing an oxide hard mask as well as chemical oxide removal (COR) which preserves the oxide hard mask over the gate stack thereby avoiding Si growth on the gate stack during RSD formation. The present invention thus provides a reliable robust alternative to the prior art RSD integration scheme mentioned in the background section of the present application.

Specifically, the method of the present invention, which is employed in fabricating a CMQS device having RSD regions, comprises the steps of: providing a material stack atop a surface of a semiconductor substrate, said material stack comprising an oxide hard mask located atop a gate conductor, which is located atop a gate dielectric; patterning said oxide hard mask and said gate conductor of said material stack; forming a disposable spacer on at least each sidewall of said patterned gate conductor; removing portions of said gate dielectric not protected by said disposable spacers and said patterned gate conductor to expose portions of said semiconductor substrate, wherein said removing comprises a chemical oxide removal step; forming raised source/drain regions in exposed portions of said semiconductor substrate; and removing said disposable spacers to expose portions of said semiconductor substrate abutting the patterned gate conductor.

In a preferred embodiment of the present invention, the disposable spacer that is formed on at least each sidewall of the patterned gate conductor is composed of $SiO_2$ since selective epi processes, which are used in forming the RSD regions, are more selective to $SiO_2$ than SiN.

In some embodiments of the present invention, the oxide hard mask and the gate dielectric beneath the disposable spacers are removed during the removing of the disposable spacers.

After removing the disposable spacers and optionally the oxide hard mask and the gate dielectric beneath the disposable spacers, the method of the present invention further comprises the steps of: forming source/drain extension regions in portions of the semiconductor substrate that are left exposed after said removing step; and forming source/drain regions in at least said raised source/drain regions.

In some embodiments of the present invention, the source/drain regions may be formed prior to removing the disposable spacers.

BRIEF DESCRIPTION OF DRAWINGS

These and other objects, features and advantages of the present invention will become apparent from the following detailed description and the appended drawings in which.

DETAILED DESCRIPTION

Figure 1:
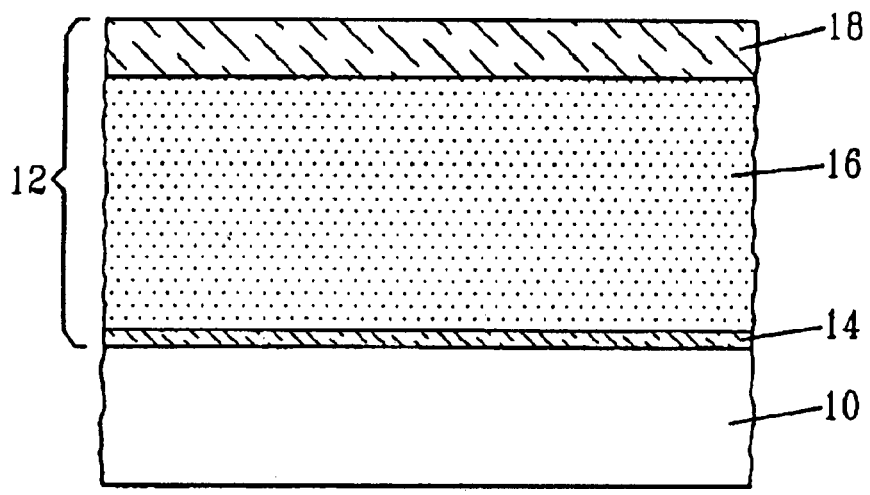
FIGS. 1–9 pictorial representations (through cross sectional views) illustrating the basic processing steps of the present invention.

The present invention, which provides a processing scheme for fabricating a semiconductor device having RSD regions, will now be described in more detail by referring to the drawings that accompany the present application. It is noted that in the accompanying drawings, like and/or corresponding elements are referred to by like reference numerals.

Reference is first made to FIG. 1 which shows an initial structure that is utilized in the present invention. The initial structure illustrated in FIG. 1 comprises a semiconductor substrate 10 having a material stack 12 formed on a surface of semiconductor substrate 10. Material stack 12 comprises a gate dielectric 14 located atop a surface of semiconductor substrate 10, a gate conductor 16 located atop gate dielectric 14 and an oxide hard mask 18 located atop gate conductor 16.

The structure shown in FIG. 1 is comprised of materials that are well known in the art and conventional processes that are also well known in the art are employed in fabricating the same. For example, semiconductor substrate 10 comprises any semiconductor material including, but not limited to: Si, Ge, SiGe, GaAs, InAs, InP and all other III/V compound semiconductors. Layered semiconductors comprising the same or different semiconductor material such as Si/Si, Si/SiGe and silicon-on-insulator (SOI) may be also employed In the present invention. In an SOI substrate, a buried insulating material, such as an oxide, electrically insulates a top Si-containing layer from a bottom Si-containing layer. Semiconductor substrate 10 may be undoped or doped with an n- or p-type dopant depending on the type of device to be fabricated.

Semiconductor substrate 10 may include various isolation regions such as shallow trench isolation (STI) regions or local oxidation of silicon (LOCOS) isolation regions formed in the surface thereof utilizing conventional processes well known to those skilled in the art. For clarity, the drawings of the present invention do not specifically show the presence of the isolation regions, however, reference numeral 10 is meant to include those regions. One highly preferred semiconductor substrate 10 employed in the present invention is a substrate that is comprised of Si.

Gate dielectric 14 of material stack 12 is then formed on a surface of semiconductor substrate 10 utilizing a deposition process such as chemical vapor deposition (CVD), plasma-assisted CVD, atomic layer CVD, evaporation, sputtering and chemical solution deposition. Alternatively, gate dielectric 14 may be formed by a thermal oxidation, nitridation or oxynitridation process. Combinations of the aforementioned processes may also be used in forming gate dielectric 14 on the surface of semiconductor substrate 10.

Gate dielectric 14 is comprised of an insulating material including, but not limited to: an oxide, nitride, oxynitride or any combination thereof. A highly preferred insulating material that is employed in the present invention as gate dielectric 14 is $SiO_2$. Although it is preferred to use $SiO_2$ as the gate dielectric material, the present invention also contemplates using insulating materials, i.e., dielectrics, which have a higher or lower dielectric constant, k, than $SiO_2$. For example, gate dielectric 14 may be comprised of a high-k oxide such as $Al_2O_3$ or a perovskite-type oxide.

The physical thickness of gate dielectric 14 may vary, but typically gate dielectric 14 has a thickness of from about 0.5 to about 20 nm, with a thickness of from about 1.0 to about 10.0 nm, being more highly preferred.

After forming gate dielectric 14 on the surface of semiconductor substrate 10, gate conductor 16 is formed on an exposed upper surface of gate dielectric 14. Gate conductor 16 is comprised of a conductive material including, but not limited to: elemental metals such as W, Pt, Pd, Ru, Re, Ir, Ta, Mo or combinations and multilayers thereof; suicides and nitrides of the foregoing elemental metals; polysilicon either doped or undoped; and combinations and multilayers thereof. One highly preferred conductive material employed as gate conductor 16 is doped polysilicon.

Gate conductor 16 is formed utilizing a deposition process such as CVD, plasma-assisted CVD, sputtering, evaporation, chemical solution deposition and plating. When metal suicides are employed, a conventional silicidation process may be used in forming the same. On the other hand, when doped polysilicon is employed as gate conductor 16, the doped polysilicon may be formed by an in-situ doping deposition process, or alternatively, a layer of undoped silicon is first deposited and thereafter an ion implantation is employed in doping the undoped polysilicon. The doping of the undoped polysilicon may occur immediately after deposition or in a later processing step after the oxide hard mask has been completely removed from the structure.

The physical thickness of gate conductor 16 formed at this point of the present invention may vary depending on the conductive material employed as well as the process used in forming the same. Typically, however, gate conductor 16 has a thickness of from about 20 to about 400 nm, with a thickness of from about 50 to about 200 nm being more highly preferred.

After forming the gate conductor 16 atop the gate dielectric 14, an oxide hard mask 18 is formed atop the gate conductor 16. Oxide hard mask 18 is formed utilizing a deposition process such as CVD or plasma-assisted CVD in which tetraethylorthosilicate (TEOS) is employed as the precursor source gas. The physical thickness oxide of hard mask 18 may vary, but typically, oxide hard mask 18 has a physical thickness of from about 25 to about 60 nm.

Figure 2:
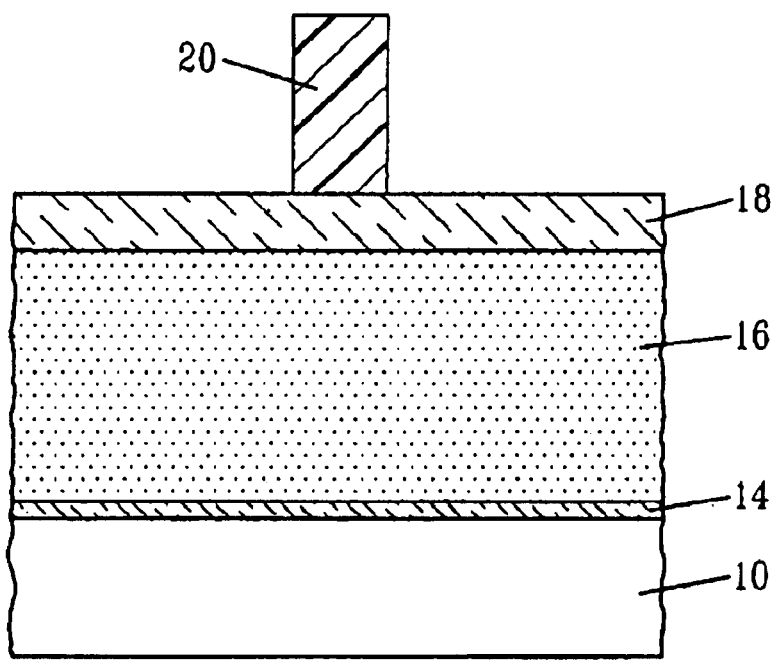

After providing the initial structure shown in FIG 1, a patterned resist image 20 is formed on predetermined portions of oxide hard mask 18. The resultant structure including patterned resist image 20 is shown, for example, in FIG. 2. It is noted that although FIG. 2 shows the presence of a single patterned resist image 20, the present invention works when more than one patterned resist image is formed on oxide hard mask 18. Thus, the present invention is capable of forming a plurality of CMOS devices atop the surface of semiconductor substrate 10.

Patterned resist image 20 shown in FIG. 2 is formed by first depositing a conventional photoresist on the surface of oxide hard mask 18. This depositing step may include the use of a conventional spin-on coating process. Following deposition of the photoresist, the deposited photoresist is subjected to lithography which includes exposing the deposited photoresist to a pattern of radiation, and developing the pattern formed in the deposited photoresist by utilizing a conventional developer solution.

Figure 3:
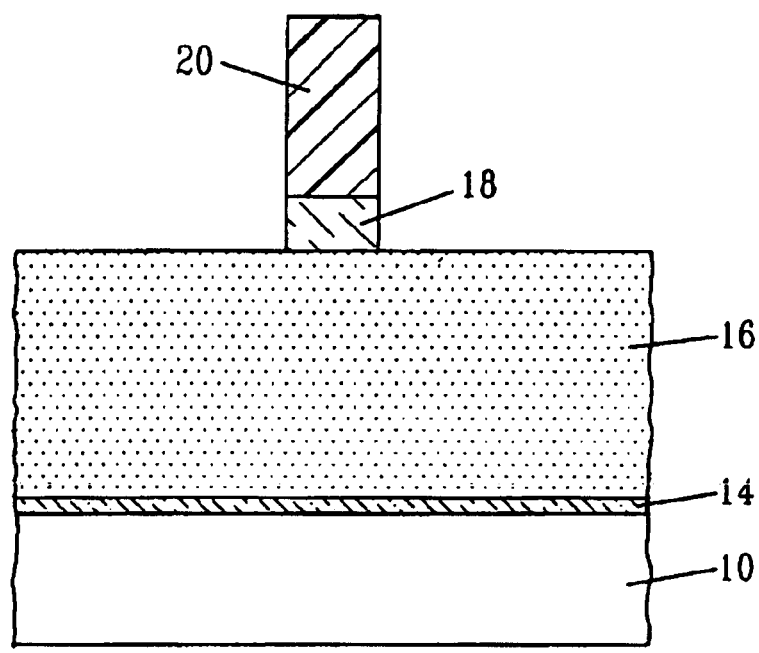

After providing patterned resist image 20 on portions of oxide hard mask 18, the pattern present in the resist image is transferred to the oxide hard mask 18 providing the structure shown, for example, in FIG. 3. In FIG. 3, the patterned oxide hard mask is labeled as 18" to distinguish it from the unpatterned oxide hard mask 18. The pattern transfer is accomplished in the present invention by utilizing a dry etching process such as reactive-ion etching (RIE), plasma-etching, ion beam etching or laser ablation. Alternatively, a spun-on or deposited anti-reflection coating underlying the resist (not shown) can be patterned in the same step.

Figure 4:
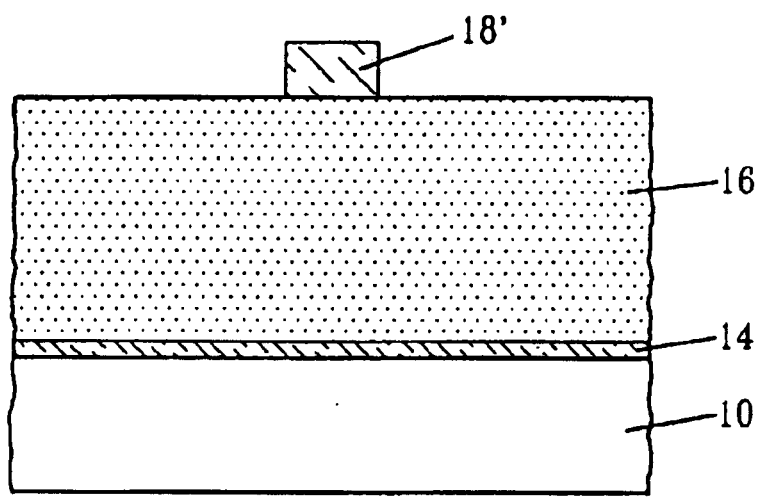

Next, patterned resist image 20 is removed from the structure providing the structure shown, for example, in FIG. 4. The patterned resist image 20 is removed in the present invention by utilizing a conventional resist stripping process that is well known to those skilled in the art.

Following patterned resist image 20 removal, the structure shown in FIG. 4 having patterned oxide hard mask 18' is then subjected to an etching process which removes portions of gate conductor 16 that are not protected by patterned oxide hard mask 18'. Specifically, etching is performed utilizing an anisotropic wet chemical etching process where a chemical etchant that is highly selective in etching a conductive material as compared to an oxide, nitride or oxynitride is employed. An example of such an etching process is HBr RIE. The resultant structure formed after this etching step is shown, for example, in FIG. 5.

Figure 5:
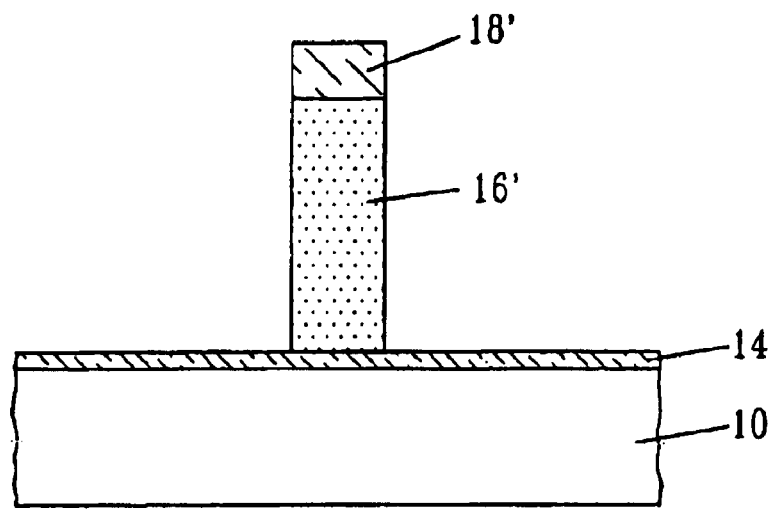

In FIG. 5, there is shown a structure which includes a patterned oxide hard mask 18' located atop a patterned gate conductor 16'. The patterned gate conductor 16' is located atop gate dielectric 14 which is located atop semiconductor substrate 10.

The patterned gate conductor 16' forms the gate of a CMOS device. Note that the present invention also contemplates the formation of a plurality of patterned gates on the surface of the gate dielectric.

Following gate definition and etching, patterned gate conductor 16' is subjected to a post gate etch cleaning process. Unlike the prior art where aqueous HF is employed in the post gate etch cleaning process, the method of the present invention utilizes a COR (chemical oxide removal) etching process instead. The COR etching process used at this point of the present invention does not substantially attack patterned oxide hard mask 18' as is typically the case when aqueous HF is employed as the post etch cleaning etchant. This attack can result in exposure of the sidewalls of the patterned gate conductor 16' during the subsequent formation of spacers.

The COR process used in this post gate etch cleaning step includes a step of exposing the structure to a gaseous mixture of HF and ammonia, preferably in a ratio of 2:1, at a pressure between 1 mTorr and 10 mTorr and a temperature of about 25° C. During this exposure, the HF and ammonia gases react with the sidewall residue of the gate etch to form a solid reaction product. The solid reaction product is removed in a second step which includes heating the structure to a temperature to a temperature about 100° C., thus causing the reaction product to evaporate. Alternatively, the reaction product may be removed by rinsing the structure in water, or removing with an aqueous solution.

Following the post gate etch cleaning step described above, the structure may be subjected to a gate reoxidation process which forms a thin layer of oxide (not specifically shown In the drawings) about the structure shown In FIG. 5. The thin layer of oxide forms atop the Si surface and exposed sidewalls of the patterned gate conductor 16'. The gate reoxidation process employed at this point of the present includes a thermal oxidation process that is performed in an oxidizing ambient at a temperature of about 900° C. or greater. Optionally, a $SiO_2$ liner (not specifically shown) may be formed about the structure shown in FIG. 5 utilizing a conventional deposition process.

Figure 6:
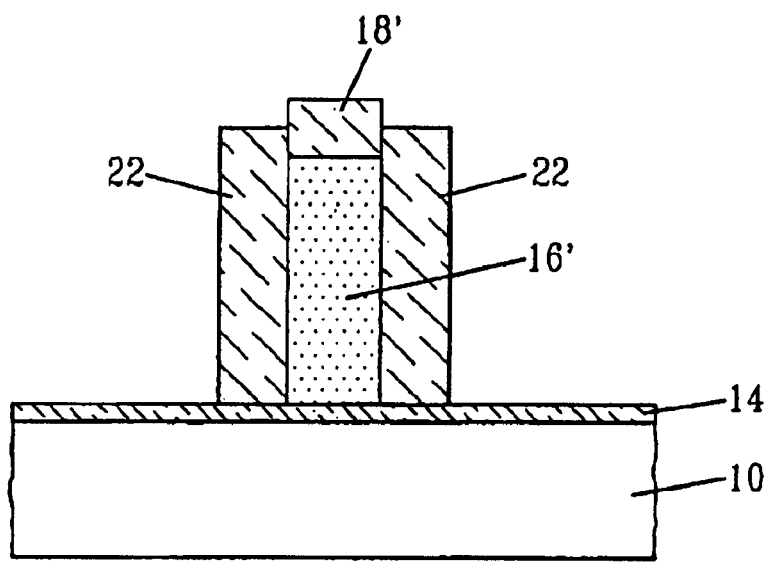

Next, and as illustrated in FIG. 6, disposable spacer 22 is formed on at least each sidewall of patterned gate conductor 16'. Note that an upper portion of each disposable spacer 22 may extend onto the exposed sidewalls of the patterned oxide hard mask 18' as well. Disposable spacer 22 is comprised of a conventional insulating material such as an oxide, nitride, oxynitride or any combination including multilayers thereof. Preferably, disposable spacer 22 is composed of SiN or $SiO_2$, with $SiO_2$ spacers being especially preferred in the present invention. Low density deposited $SiO_2$ such as tetraethylorthosilicate (TEOS), for example, are especially preferred since it is known that conventional selective epi growth processes are more selective to $SiO_2$ than SiN. Disposable spacer 22 is formed utilizing a deposition process followed by RIE. The term disposable spacer is used herein since spacer 22 will be removed later on In the inventive method.

Figure 7:
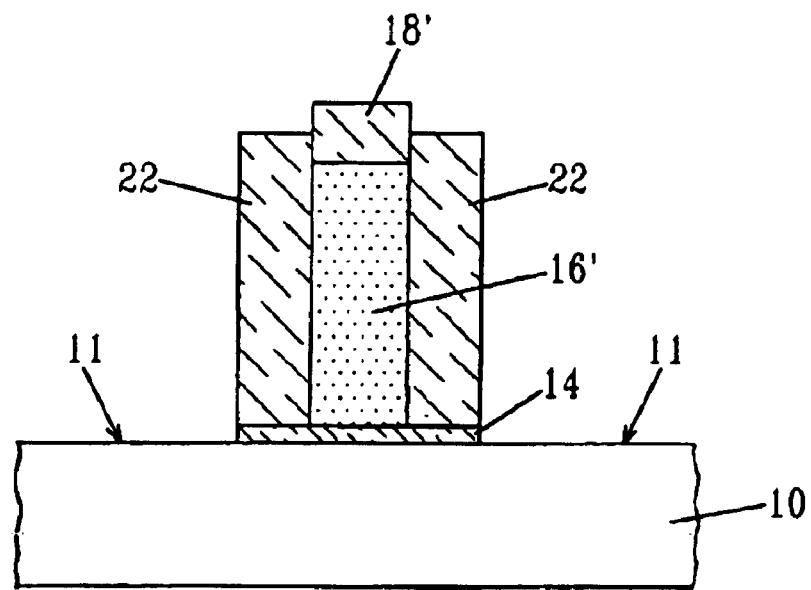

After disposable spacer 22 formation, a pre-RSD cleaning process, which removes gate dielectric 14 not protected by disposable spacers 22 and the stack of patterned oxide hard mask 18'/gate conductor 16', is employed. FIG. 7 provides an illustration of the resultant structure that Is formed after this COR etching process; note that regions of semiconductor substrate underlying the removed gate dielectric are now exposed. The exposed portions of the semiconductor substrate 10 are labeled as 11 in FIG. 7.

The pre-RSD cleaning process of the present invention utilizes another COR (chemical oxide removal) etching process instead of aqueous HF. The COR process used at this point of the present invention does not substantially attack patterned oxide hard mask 18' as is typically the case when aqueous HF is employed. Aqueous HF attack can result in unwanted removal of the patterned oxide hard mask 18', from the patterned gate conductor 16' thereby exposing the patterned gate conductor 16'. The exposed patterned gate conductor 16' may, if it is comprised of polysilicon, be available as an active substrate during subsequent growth of the RSD regions. Growth on exposed gate conductor can result in gate to source/drain shorts and can result in Si overhang in the extension regions. This overhang can interfere with extension implants.

The COR process used in this pre-RSD cleaning process includes a step of exposing the structure to a gaseous mixture of HF and ammonia, preferably in a ratio of 2:1, at a pressure between 1 mTorr and 10 mTorr and a temperature of about 25° C. During this exposure, the HF and ammonia gases react with the gate dielectric material to form a solid reaction product. The solid reaction product is removed in a second step which includes heating the structure to a temperature about 100° C., thus causing the reaction product to evaporate and rinsing the structure in water, or removing with an aqueous solution.

It is noted that the COR processes utilized in the present invention have a much different selectivity than does an aqueous HF etch of $SiO_2$. In particular, the COR reaction etches the TEOS oxide hard mask at a slower rate than that of a thermally grown oxide. Thus, thermal oxide is readily etched, while retaining far more TEOS than is retained in an aqueous HF etch to clean the Si surface.

Following the COR etching of the exposed gate dielectric from the structure, RSD regions 24 are formed on the exposed portions 11 of semiconductor substrate 10. The RSD regions are formed In the present invention utilizing a conventional epi Si growth process. The resultant structure, including RSD regions 24, is shown, for example, in FIG. 8.

Figure 9:
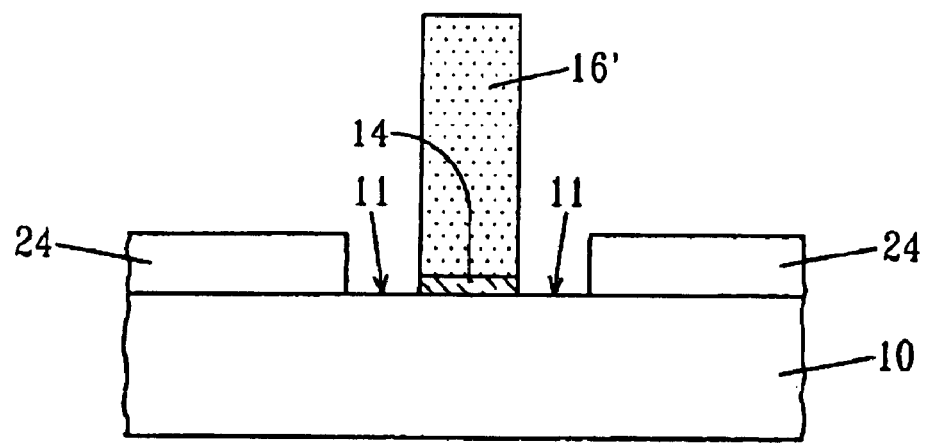

Following formation of RSD regions 24, patterned oxide hard mask 18, disposable spacers 22 and gate dielectric 14 underlying the disposable spacers are removed by utilizing a wet etching process, a dry etching process or any combination thereof including multiple etching steps. The resultant structure that is formed after this step of the present invention has been performed is shown, for example, in FIG. 9. Note that exposed portions 11 of semiconductor substrate 10 are formed after this removal step.

In an alternative embodiment, the source/drain ion implants are performed at this point of the present invention and thereafter the implants are activated by a high temperature rapid thermal anneal to activate the junctions.

Figure 10:
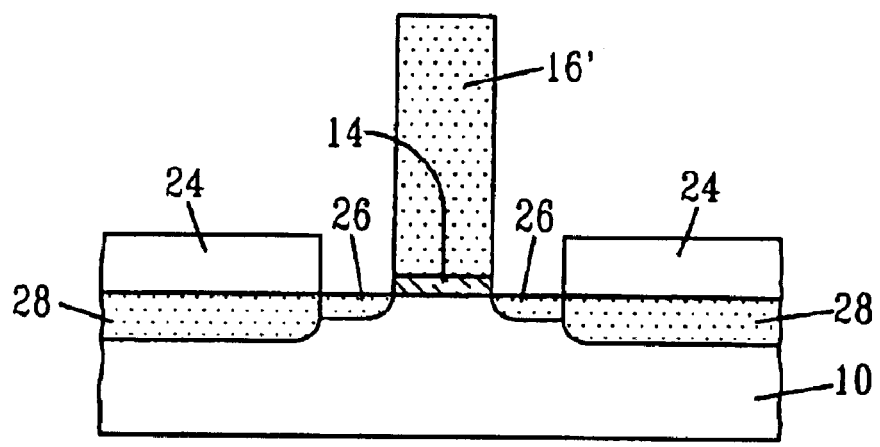
FIG. 10 is a pictorial representation (through a cross sectional view) illustrating the structure that is formed after formation of source/drain extension regions and source/drain regions.

Next, source/drain extension regions 26 and source/drain regions 28 may be formed providing the structure shown in FIG. 10. In accordance with the present invention, the source/drain extension regions 26 are formed in areas of the semiconductor substrate that previously were protected by disposable spacers 22. In another embodiment, a thin sidewall spacer may be formed and used to offset the extension implants from the gate edge. After extension Implants, a source/drain spacer, which extends laterally at least as far as the original disposable spacer, is formed. Next, the source/drain implants are performed.

Regions 26 are formed by utilizing a conventional ion implantation process.

Activation of the implants typically occurs at a temperature of about 800° C. or greater for a time period of about 3 seconds or greater. Other annealing conditions are also contemplated herein provided that they are capable of activating the implant regions.

Figure 11:
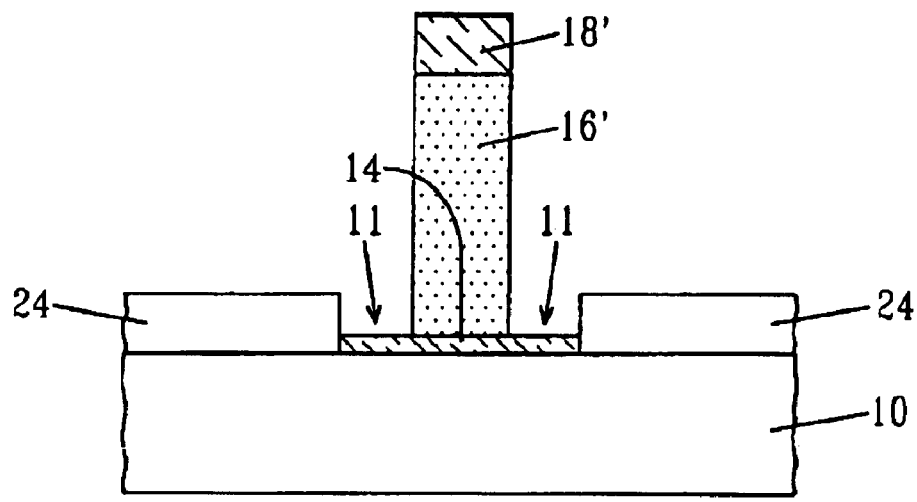
FIGS. 11–12 are pictorial representations (through cross sectional views) illustrating an alternative embodiment of the present invention in which the disposable spacer 22 of FIG. 8 is removed, but the oxide hard mask 18" and the gate dielectric 14 are left intact.
Figure 12:
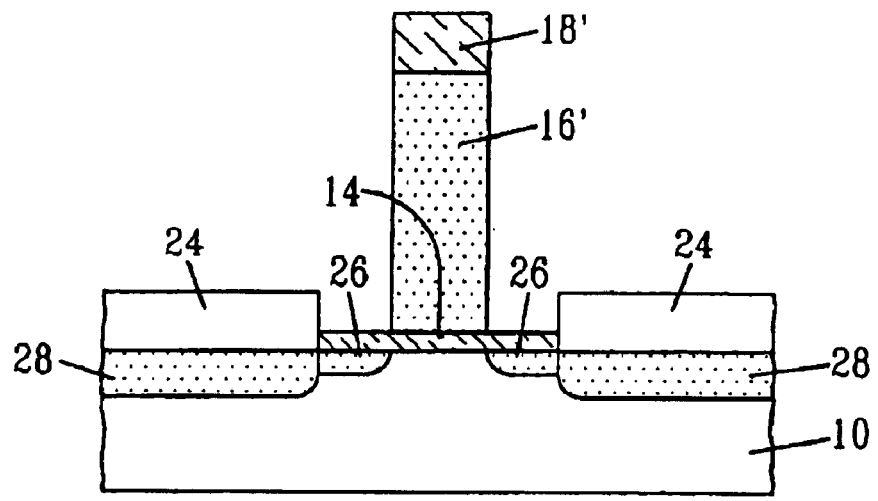

An alternative embodiment of the present Invention Is shown in FIGS. 11 and 12.

Figure 8:
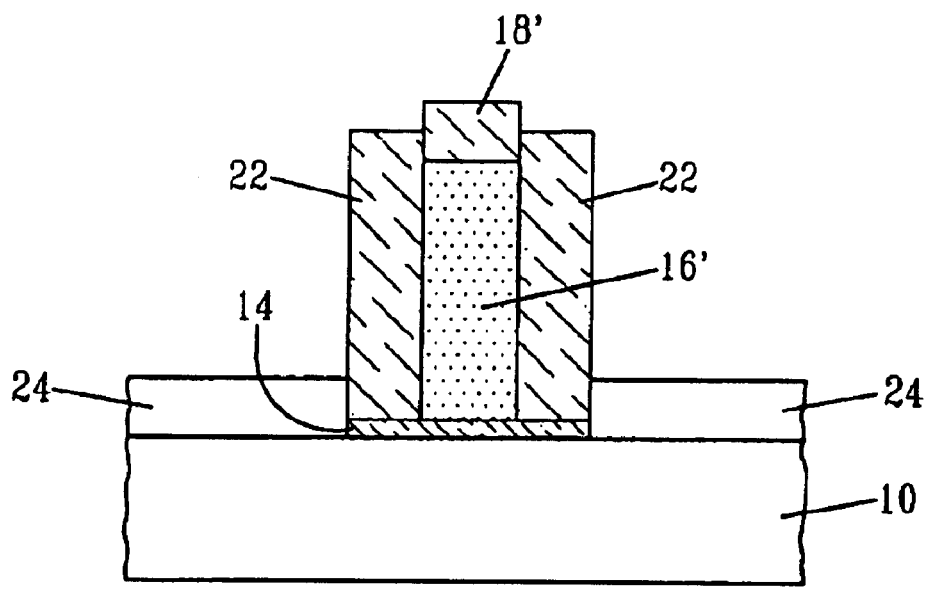

In this alternative embodiment, the disposable spacer 22 of FIG. 8 is removed, but the oxide hard mask 18' and the gate dielectric 14 are left intact. For instance, if the disposable spacer 22 is comprised of silicon nitride and the hard mask is comprised of TEOS, then the spacer 22 can be removed by a hot phosphoric acid solution. In such an embodiment, the gate 16' is not further doped during ion implantation of the extensions, and the gate dielectric, 14 can serve as a screen for the ion implantation.

If $BF_2$ is used for implanting the P-FET extensions, then improvement from reduced boron penetration of the gate dielectric is expected.

While the present invention has been particularly shown and described with respect to preferred embodiments thereof, it will be understood by one skilled in the art that the foregoing and other changes in form and detail may be made without departing from the spirit and scope of the present invention. It is therefore intended that the present invention not be limited to the exact forms and details described and illustrated, but fall within the scope of the appended claims.

What is claimed is:

1. A method of forming a complementary metal oxide semiconductor (CMOS) device comprising the steps of:
    (a) providing a material stack atop a surface of a semiconductor substrate, said material stack comprising an oxide hard mask located atop a gate conductor, which is located atop a gate dielectric;
    (b) patterning said oxide hard mask and said gate conductor of said material stack;
    (c) performing a post etch cleaning step utilizing a first chemical oxide removal (COR) step;
    (d) forming a disposable spacer on at least each sidewall of said patterned gate conductor;
    (e) removing portions of said gate dielectric not protected by said disposable spacers and said patterned gate conductor to expose portions of said semiconductor substrate wherein said removing comprises a second chemical oxide removal step;
    (f) forming raised source/drain regions in said exposed portions of the semiconductor substrate; and
    (g) removing said disposable spacers to expose portions of said semiconductor substrate abutting the patterned gate coductor.

2. The method of claim 1 further comprising the steps of:
    forming source/drain extension regions in portions of said semiconductor substrate that are left exposed after removing step g; and
    forming source/drain regions in at least said raised source/drain regions.

3. The method of claim 1 wherein said oxide hard mask is comprised of an oxide formed by chemical vapor deposition of tetraethylorthosilicate.

4. The method of claim 1 wherein said first COR process comprises a gaseous mixture of HF and ammonia.

5. The method of claim 4 wherein said gaseous mixture of HF and ammonia comprises a ratio of 2 parts HF and 1 part ammonia.

6. The method of claim 1 wherein said first COR process is performed at a pressure between 1 mTorr and at a temperature of about 25° C.

7. The method of claim 1 wherein said disposable spacers are comprised of $SiO_2$.

8. The method of claim 1 wherein said second COR process comprises a gaseous mixture of HF and ammonia.

9. The method of claim 8 wherein said gaseous mixture of HF and ammonia comprises a ratio of 2 parts HF and 1 part ammonia.

10. The method of claim 1 wherein said second COR process is performed at a pressure between 1 mTorr and at a temperature of about 25° C.

11. The method of claim 10 wherein said second COR process results in the formation of a solid reaction product.

12. The method of claim 11 wherein said solid reaction product is removed by heating to a temperature of about 100° C., rinsing in water, or an aqueous solution.

13. The method of claim 11 wherein said solid reaction product is removed by heating to a temperature of about 100° C. and with an aqueous HF solution.

14. The method of claim 1 wherein step (f) comprises an epi Si growth process.

15. The method of claim 1 further comprising forming source/drain regions prior to the removing of the disposable spacers.

16. The method of claim 1 wherein said removing of the disposable spacers further comprises the removing of the oxide hard mask and the removing of the gate dielectric underlying the disposable spacers.

17. The method of claim 1 wherein said removing of the disposable spacers does not remove the oxide hard mask and the underlying gate dielectric.

18. The method of claim 17 wherein the disposable spacers are removed by hot phosphoric acid.

19. A method of forming a complementary metal oxide semiconductor (CMOS) device comprising the steps of:

(a) providing a material stack atop a surface of a semiconductor substrate, said material stack comprising an oxide hard mask located atop a gate conductor, which is located atop a gate dielectric;

(b) patterning said oxide hard mask and said gate conductor of said material stack;

(c) performing a post etch cleaning step utilizing a first chemical oxide removal (COR) step;

(d) forming a disposable spacer comprising $SiO_2$ on at least each sidewall of said patterned gate conductor;

(e) removing portions of said gate dielectric not protected by said disposable spacers and said patterned gate conductor to expose portion of said semiconductor, wherein said removing comprising a second COR step;

(f) forming raised source/drain regions in said exposed portions of the semiconductor substrate; and (g) removing said disposable spacers to expose portions of said semiconductor substrate abutting the patterned gate conductor.

20. The method of claim 19 wherein said first and second COR steps comprise a gaseous mixture of HF and ammonia.

21. The method of claim 19 wherein said removing of the disposable spacers further comprises the removing of the oxide hard mask and the removing of the gate dielectric underlying the disposable spacers.

22. The method of claim 19 wherein said removing of the disposable spacers does not remove the oxide hard mask and the underlying gate dielectric.

23. The method of claim 19 wherein the disposable spacers are removed by hot phosphoric acid.

* * * * *